United States Patent [19]
Brodsky et al.

[11] Patent Number: 5,807,788
[45] Date of Patent: Sep. 15, 1998

[54] METHOD FOR SELECTIVE DEPOSITION OF REFRACTORY METAL AND DEVICE FORMED THEREBY

[75] Inventors: Stephen Bruce Brodsky, Fishkill; Richard Anthony Conti, Mt. Kisco; Seshadri Subbanna, Brewster, all of N.Y.

[73] Assignee: International Business Machines Corporation, Armonk, N.Y.

[21] Appl. No.: 753,128

[22] Filed: Nov. 20, 1996

[51] Int. Cl.$^6$ .................................................. H01L 21/44
[52] U.S. Cl. .......................... 438/653; 438/655; 438/656
[58] Field of Search ............................ 437/192; 438/653, 438/655, 656

[56] References Cited

U.S. PATENT DOCUMENTS

| | | | |
|---|---|---|---|
| 4,740,483 | 4/1988 | Tobin ........................................ | 437/187 |
| 5,084,417 | 1/1992 | Joshi et al. ............................... | 437/192 |
| 5,112,439 | 5/1992 | Reisman et al. ......................... | 156/656 |
| 5,202,287 | 4/1993 | Joshi et al. ............................... | 437/192 |
| 5,221,853 | 6/1993 | Joshi et al. ............................... | 257/384 |
| 5,433,975 | 7/1995 | Roberts et al. .......................... | 427/253 |

OTHER PUBLICATIONS

D. Hisamoto, et al., "Metallized Ultra–Shallow–Junction Device Technology for . . . " IEEE Transactions on Electron Devices, vol. 41, No. 5, May 1994, pp. 745–750.

Y. Nakamura, et al., "Surface Reaction Controlled W–CVD Technology for 0.1um . . . ".

T. Kosugi, et al., "Novel Si Surface Cleaning Technology with Plasma Hydrogenation and Its . . . ", 1995 Symposium on VLSI Technology Digest of Technical Papers, pp. 41–42.

M. Sekine, et al., "Self–Aligned Tungsten Strapped Source/Drain and Gate Technology . . . ", IEEE, International Electron Devices Meeting 1994, Technical Digest, pp. 19.3.1–19.3.4.

Y. Nakamura, et al., "Mechanism Causing p+/n+ Growth Differences and Encroachment in Selective W–stacked CMOS Applications", Semiconductor Development Center, Semiconductor & Integrated Circuits Div., Hitachi, Ltd., pp. 1–6.

D. Hisamoto, et al., "High–Performance Sub–0.1–um CMOS with Low–Resistance T–Shaped Gated Fabricated by Selective CVD–W", 1995 Symposium on VLSI Technology, Digest of Technical Papers, IEEE, pp. 115–116.

*Primary Examiner*—Charles L. Bowers, Jr.
*Assistant Examiner*—Reneé R. Berry
*Attorney, Agent, or Firm*—Schmeiser, Olsen & Watts; Joseph P. Abate, Esq.

[57] ABSTRACT

A method and the device produced by the method of selective refractory metal growth/deposition on exposed silicon, but not on the field oxide is disclosed. The method includes preconditioning a wafer in a DHF dip followed by the steps of 1) selectively depositing a refractory metal on the exposed surfaces of the silicon substrate by reacting a refractory metal halide with the exposed surfaces of said silicon substrate; 2) limiting silicon substrate consumption by reacting the refractory metal halide with a silicon containing gas; and 3) further increasing the refractory metal thickness by reacting the refractory metal halide with hydrogen. Through an adequate pretreatment and selection of the parameters of 1) temperature; 2) pressure; 3) time; 4) flow and 5) flow ratio during each of the deposition steps, this invention adequately addresses the difficulties of uneven n+ versus p+ (source/drain) growth, deep consumption/encroachment by the refractory metal into silicon regions (e.g., worm holes), poor adhesion, uncontrolled selectivity and uneven morphology.

19 Claims, 3 Drawing Sheets

METHOD FOR SELECTIVE DEPOSITION OF REFRACTORY METAL AND DEVICE FORMED THEREBY

BACKGROUND OF THE INVENTION

1. Field of the Invention

The present invention relates to deposition techniques for forming metal regions on semiconductor substrates, and more particularly, to the selective deposition of refractory metals on semiconductor substrates and the integrated circuit (IC) devices formed thereby.

2. Description of the Related Art

The continued miniaturization of integrated circuits has brought about an increasing need to fabricate source/drain/gate structures and contact metallurgy with acceptable electrical characteristics. In recent years, much effort has been focused on the use of metal suicides to fulfill this need. However, as device dimensions become even smaller, both vertically and horizontally, silicides lose their attractiveness. The intrinsic resistivity of the silicides is high compared to metals. In addition, silicide consumption (vertical growth/deposition of the silicide into the substrate) and encroachment (horizontal growth/deposition of the silicide into the substrate) is too large for the contact structures proposed for future devices. By way of example, in the case of formation of cobalt disilicide ($CoSi_2$), approximately 3.4 Angstroms (A) of silicon substrate are consumed for every A of $CoSi_2$ formed. Other silicides used in the source/drain regions of the Field Effect Transistors (FETs) usually consume about 500 A of silicon from the junction. This requires forming deep source/drain regions using two photomask steps and a thick source drain spacer.

Refractory metals have been investigated as possible alternatives to silicides. Their low resistivity and relatively high temperature stability makes the refractory metals attractive. In addition, the recent development of selective chemical vapor deposition (CVD) processes, have made refractory metals, such as tungsten (W) and molybdenum (Mo), prime candidates to replace silicides. However, processes used in depositing refractory metals still have limitations which have not been adequately addressed.

One difficulty is uneven growth/deposition rates upon $n^+$ and $p^+$ (e.g., source/drain) diffusion regions. This is undesirable. For both contact resistance and sheet resistance, there should be no difference between resistance in the n+ and p+ diffusion regions.

Another difficulty is deep consumption/encroachment by the refractory metal into the silicon regions. Selective refractory metal films, such as W, similar to silicides, consume Si during their formation. As device dimensions decrease, the depth of the junction is reduced and consumption/encroachment must be minimized to prevent damage to the device. Shallow junctions are especially sensitive to these phenomena and high junction leakage can occur if consumption and encroachment are not minimized. The desired Si consumption should be limited to less than 100 A.

Poor adhesion is another difficulty. Refractory metal films, such as W, are known to not adhere well to Si substrates due to the presence of native oxide. This may result in peeling of the W film during subsequent thermal cycling after further processing of the wafer.

Another difficulty arises when selectivity of the growth/deposition of the refractory metal is uncontrolled. An ideal selectively deposited metal grows only on exposed Si and not on the surrounding oxide/nitride. When the refractory metal grows on the exposed areas that are not silicon, shorting of adjacent components can occur. In addition, encroachment problems may occur due to the refractory metal penetrating along nearby silicon dioxide/silicon interfaces.

The morphology of the selective refractory metal film should be smooth at the Si interface. If the surface is rough, spiking may occur into the Si resulting in device failure. Having a smoother refractory metal film provides better contact resistance. In addition, a smooth surface is more effectively covered by thin metal liner layers that are required as adhesion layers for deposition of subsequent metal layers. Smooth films are also more readily integrated with photolithographic processes.

In accordance with one particular CVD technique, tungsten (W) is deposited on the surface areas of a silicon substrate by placing the substrate in a CVD reactor and heating the substrate. Tungsten hexafluoride ($WF_6$) and an inert carrier gas such as argon (Ar) or nitrogen ($N_2$) are then fed into the reactor and the $WF_6$ reacts with the silicon substrate in accordance with the following:

$$2WF_6 + 3Si \Rightarrow 2W + 3SiF_4$$

The deposition of W will stop and in order to deposit additional material, hydrogen ($H_2$) is added to the $WF_6$ and carrier gas. The $WF_6$ will react with the $H_2$ to deposit the desired additional W in accordance with the following:

$$WF_6 + 3H_2 \Rightarrow W + 6HF.$$

Another deposition technique is disclosed in U.S. Pat. 5,202,287 to Joshi et al., assigned to International Business Machines Corporation and entitled Method of a Two Step Selective Deposition of Refractory Metals Utilizing $SiH_4$ Reduction and $H_2$ Reduction. This two step process includes a first deposition step, such as silane ($SiH_4$) reduction of a tungsten hexaflouride ($WF_6$) in accordance with the following:

$$2WF_6 + 3SiH_4 \Rightarrow 2W + 3SiF_4 + 6H_2$$

followed by a further selective deposition process of reacting $WF_6$ with hydrogen:

$$WF_6 + 3H_2 \Rightarrow W + 6HF.$$

The use of the above processes to selectively deposit tungsten for Very Large Scale Integration VLSI application has been limited by problems inherent in the deposition process. The results of each deposition step are dependent upon five parameters: 1) temperature; 2) pressure; 3) time; and 4) flows and 5) flow ratio. The deposition steps and the parameters used in the deposition steps of the heretofore mentioned processes have not adequately addressed the following: a). uneven n+ versus p+ (source/drain) growth/deposition; b). deep consumption/encroachment by the refractory metal into silicon regions (e. g., worm holes); c). poor adhesion; d). uncontrolled selectivity and e). uneven morphology.

SUMMARY OF THE INVENTION

This invention is directed to a method and an integrated circuit produced by the method for selectively depositing a refractory metal layer on exposed silicon surfaces of a silicon substrate utilizing a three step deposition process. The steps of the deposition process include: selectively depositing a refractory metal on the exposed surfaces of the silicon substrate by reacting a refractory metal halide with the exposed surfaces of said silicon substrate; limiting silicon substrate consumption by reacting the refractory metal halide with a silicon containing gas; and further increasing the refractory metal thickness by reacting the refractory metal halide with hydrogen.

Through an adequate pretreatment and selection of the parameters of 1) temperature; 2) pressure; 3) time; 4) flow and 5) flow ratio during each of the deposition steps, this invention adequately addresses the difficulties of uneven n+ versus p+ (source/drain) growth, deep consumption/encroachment by the refractory metal into silicon regions (e.g., worm holes), poor adhesion, uncontrolled selectivity and uneven morphology.

This invention also has the cost advantage of depositing a selective refractory metal utilizing blanket deposition equipment (that typically operates in the 1 Torr or higher pressure regime). In most selective processes, costly equipment (using turbo and cyropumps to operate in the 1 m Torr pressure regime) must be utilized. In addition, the cost of traditional selective tungsten tooling is increased due to the use of a clustered dry etch step used before selective tungsten deposition. This invention only requires a single step of preconditioning the silicon substrate by a dilute hydrofluoric acid (DHF) dip to thereby eliminate native oxides. A vacuum break after the DHF dip is allowed.

BRIEF DESCRIPTION OF THE DRAWINGS

The preferred exemplary embodiment of the present invention will hereinafter be described in conjunction with the appended drawings, where like designations denote like elements, and.

DETAILED DESCRIPTION OF THE PREFERRED EMBODIMENTS

This invention is directed to a method and an integrated circuit produced by the method for selectively depositing a refractory metal layer on exposed silicon surfaces of a silicon substrate utilizing a three step deposition process. Before the first step, the semiconductor wafer is preconditioned by a single step of a dilute hydrofluoric acid (DHF) dip to eliminate native oxides. The dip allows the wafer to be exposed to air for up to approximately 1 hour without oxidation. Heretofore, other selective-W methods have required a two step preconditioning to achieve equivalent results which includes: 1) a DHF dip; and 2) a Si light etch (to remove contaminants in n+ and p+ regions). This invention eliminates the need for the two step preconditioning.

Figure 1:
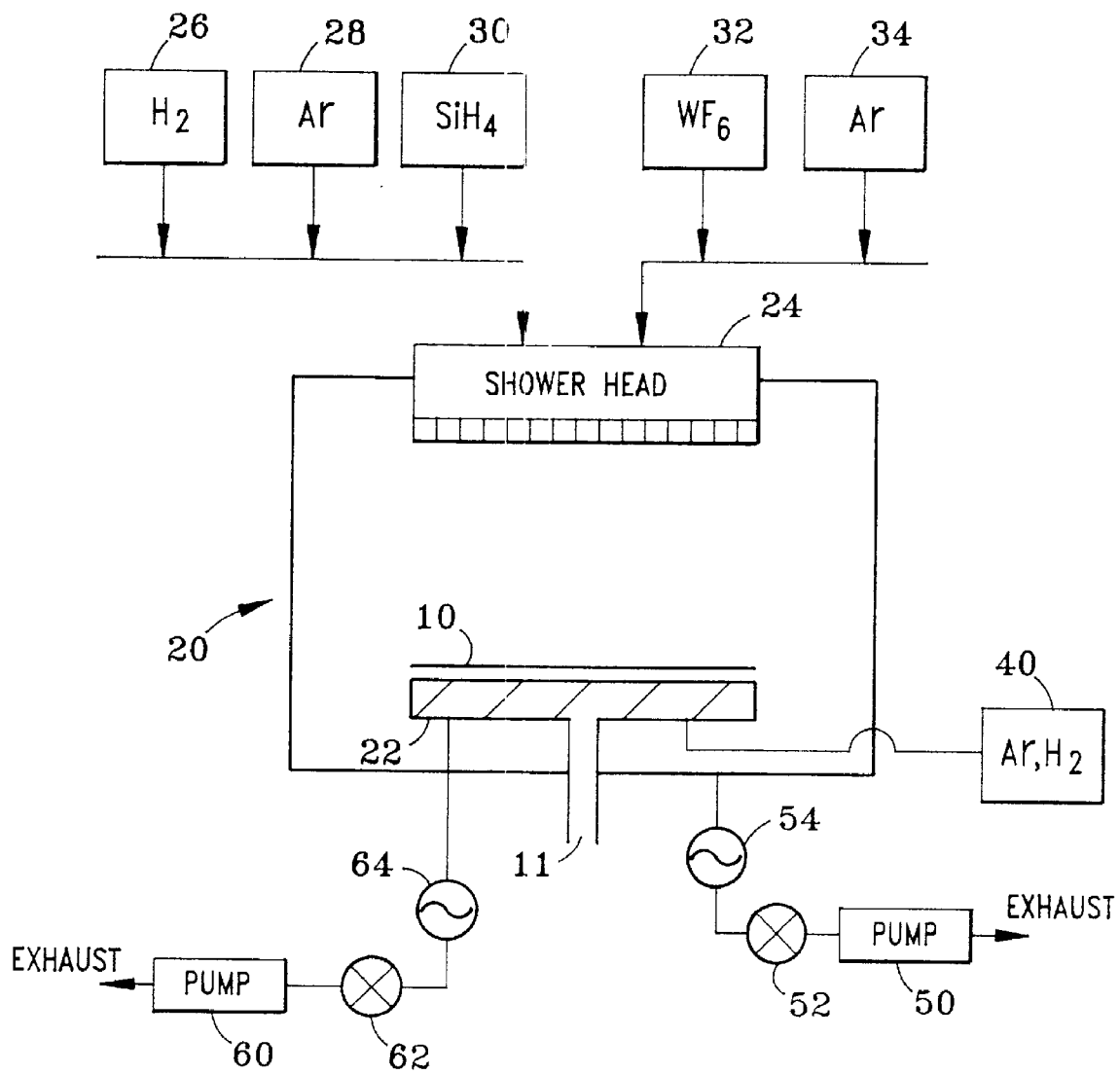
FIG. 1 is a diagrammatic view of a W CVD reactor of a preferred embodiment of the present invention.

Referring to FIG. 1, preconditioned wafer 10 is placed inside a refractory gas CVD reactor 20 on top of pedestal heater 22 having an electrical feedthrough 11. Gas is fed through the showerhead 24 through the gas sources 26, 28, 30, 32, 34. Backside gas 40 is also provided. The gas is exhausted through pump 50 by gate valve 52. Pressure is controlled using throttle valve 54. Similarly, backside gas 40 is exhausted through pump 60 through gate valve 62. Backside pressure is controlled using throttle valve 64.

Figure 2:
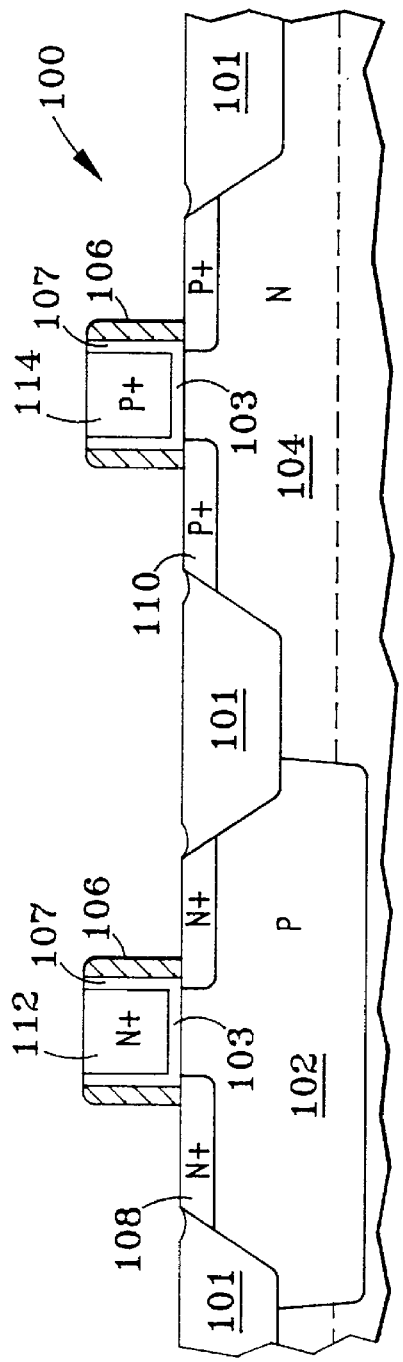
FIG. 2 is a diagrammatic view of a preferred embodiment of the present invention prior to selective W deposition.

FIG. 2 is an exemplary integrated circuit prior to selective W deposition. Integrated circuit 100 is processed by steps such as isolation formation of silicon dioxide spacers 101; doping of the silicon substrate to form a p(+/−) substrate 102 and an n(+/−) substrate 104; depositing gate oxide 103 to about 50–100 A, and the gate stack 112, 114 to about 2000 A. The gate stack oxide is formed in and etched into the n(+/−) gate stack 112 and the p(+/−) gate stack 114. After the gate stacks 112, 114 are etched, side wall oxide 107 is deposited thereon followed by a nitride or oxide spacer 106. Nitride spacer is relatively thin (approximately 100–500 A). After the chip has been processed to the embodiment shown in FIG. 2, it is ready for the DHF dip and the three step process of selective deposition of the refractory metal thereon.

During each of the selective-W deposition processing steps, seven parameters are particularly crucial in obtaining the desired results. The seven parameters include: 1) temperature, 2) pressure, 3) time, 4) $WF_6$ flow, and 5) $H_2$ flow, 6) $SiH_4$ to $WF_6$ flow ratio, and 7) Ar gas flow. The total pressure is selected to be significantly greater than the partial pressure of WF6 and SiH4.

Equipment used to deposit refractory metals may be divided into two groups: 1) blanket W tools that operate at higher total pressures (above 1 Torr and usually above 10 Torr); and 2) selective W tools that operate at "very" low total pressure (single mTorr). Heretofore, selective films of W with repeatability characteristics acceptable for commercial manufacturing have only been obtainable at low total pressure. Blanket W have usually been operated at high total pressure in manufacturing facilities. Selective W tools are more expensive than blanket W tools because: a) blanket tools are much more common as blanket deposition has wide acceptance in commercial manufacturing as compared to selective deposition; and b) selective tools are essentially blanket tools with additional modifications that raise the base cost of the tool. This invention has the unexpected advantages of successful use of blanket W equipment to perform selective W deposition simultaneously on p and n type doped silicon and of providing acceptable repeatability and device results at high total pressure, unlike previous efforts in this field. One possible reason for this success is related to the difference in growth rates of films created at different total pressures. This invention provides a selective W CVD process that operates in the $WF_6$ mass transport (diffusion) limited regime thereby depositing W selectively at a minimal rate and with dense nucleation resulting in a smoother microstructure and equal deposition over $n^+$ and $p^+$ regions (equal deposition in this context means that the W deposited on the p+ region is within at least 50% of the thickness of W deposited on the n+ region. For example, if the n+ region is 300 A then the p+ region is 150 A).

In the first step, a refractory metal, such as W, is selectively deposited on the exposed surfaces of the silicon substrate by reacting a refractory metal halide, such as $WF_6$, with the exposed surfaces of said silicon substrate in the presence of an inert gas, such as Argon (Ar) in accordance with the following:

$$2WF_6 + 3Si \Rightarrow 2W + 3SiF_4 \qquad 1.$$

In the first step, the Si substrate is exposed to $WF_6$ at a flow rate of 5–10 sccm and preferably set at 5 sccm; a temperature range of 275° to 325° C. and at a preferred temperature of 300° C.; a partial pressure range of 10–50 milliTorr (mTorr) for $WF_6$ and preferred pressure of 20 mTorr; a total pressure range of 30,000 to 100,000 mTorr, with a preferred total pressure of 40,000 mTorr (40 Torr); a period of about 1 second; a flow rate of zero for $H_2$ and a flow rate of 10,000–20,000 standard cubic centimeters/minute (sccm) for Argon (Ar) with a preferred flow of 14000 sccm. The $SiH_4$ to $WF_6$ ratio is zero. The processing time of step 1 is limited to 1 sec so that Si consumption and encroachment are minimized. After about 1 second exposure to $WF_6$, 50–100 A growth/deposition on the p+ region have been observed.

Other literature has taught the need for a two step preconditioning sequence to equalize the growth of tungsten on n+ and p+ regions. The literature has taught the use of a dilute hydrofluoric acid (DHF) dip to remove surface oxide followed by a Si light etch (exposure to a reactive ion etch) to remove other surface contaminants. According to this approach of selective tungsten deposition, the Si light etch is integral in achieving deposition on the p+ region. The fact of absence of any growth on the p+ region even after a 60 sec exposure to $WF_6$ when the Si light etch is not used is provided as evidence of the importance of this Si light etch step according to other practices of selective tungsten chemical vapor deposition.

This invention obviates the Si light etch step by growing tungsten in the initial Si reduction phase under a $WF_6$ mass transfer limited condition (high total reactor pressure). Under this condition, the growth is limited by arrival rate of $WF_6$ at the p+ and n+ surfaces thereby reducing the sensitivity to surface effects such as contamination not removed by the DHF dip. As a result, tungsten grows on both p+ and n+ regions at substantially equal thickness.

The second step includes limiting silicon substrate consumption with the refractory metal halide while increasing the refractory metal thickness by reacting the refractory metal halide with a silicon containing gas.

$$2WF_6+3SiH_4 => 2W+3SiF_4+6H_2 \qquad 2.$$

In the second step, $SiH_4$ is introduced. The gas of the second step is introduced into the CVD reactor 20 quickly in order to avoid any further consumption/encroachment of the Si substrate. In the second step, W is deposited onto the silicon substrate with these parameter settings: substrate temperature in a range of 275° to 325° C. and preferably 300° C.; $WF_6$ partial pressure in the range of 10–50 mTorr for and preferably at 20 mTorr; total pressure range in the range of 30,000 to 100,000 mTorr, and preferably 40,000 mTorr (40 Torr); $H_2$ flow in the range of 5–10 Standard Liters/Minute (SLM) and preferably 9 SLM; Ar flow in the range of 10–20 SLM and preferably 14 SLM, $SiH_4$ flow in the range of 40–50 sccm and preferably 45 sccm; and $WF_6$ in the flow range of 5–10 sccm and preferably 5 sccm. The $SiH_4/WF_6$ ratio during the second step may be as high as 10 because the time of second step is limited to 2–3 sec so that the W added by step 2 is limited to about 50 A. Si contamination in this layer does not increase the resistivity of the contact layer because incorporated excess Si is consumed in step 3.

This invention also contemplates the use of other sources of silane gas such as an alkylsilane or disilane. In particular, alkylsilanes such as diethylsilane, dimethylsilane, n-butylsilane, methylsilane, ethylsilane may be used.

The purpose of step 2 is to further limit W growth by reaction of $WF_6$ with substrate Si. W growth by reaction of $WF_6$ with substrate Si results in further substrate encroachment and consumption as Si atoms diffuse from the substrate and react with $WF_6$ (as occurs in step 1). During the silane reduction there are two reactions occurring. The first reaction is given by the silane reduction equation:

$$2WF6+3SiH4 => 2W+3SiF4+6H2;$$

the second reaction being the reaction given by the WF6 alone step equation:

$$2WF6+3Si => 2W+3SiF4.$$

Both of the reactions may occur simultaneously. By controlling the flow ratio of SiH4 to WF6 and by having a sufficiently thick W layer from the first step (50–100 A) to provide a diffusion barrier, the rates of the two reactions, relative to each other are controlled. That is, as the silane/$WF_6$ ratio becomes large, the silane reduction reaction predominates. As the ratio approaches zero, the Si reduction reaction predominates. Silane reduction deposits W while Si reduction W by consuming substrate Si. If growth predominates there is substrate consumption/encroachment but little Si contaminant within the film. If deposition predominates there is Si contamination but little substrate consumption/encroachment. This invention is motivated by minimizing substrate consumption which results in W deposition being deliberately more prevalent.

The time of step 2 is minimized to 2 to 3 seconds so as to reduce the roughness that this layer contributes to the final film, minimize selectivity loss, and minimize resistivity. This invention includes a high $SiH_4$ to $WF_6$ ratio so that Si encroachment is prevented and the excess Si incorporated in the thin $SiH_4$ reduced layer will provide Si that may be consumed by the $WF_6$ present during the subsequent $H_2$ reduction step thereby avoiding further Si encroachment.

The third step is for the purpose of further depositing the refractory metal by reacting the refractory metal halide with hydrogen.

$$WF_6+3H_2 => W+6HF \qquad 3.$$

For the third step W is deposited onto the silicon substrate with these parameter settings: substrate temperature in a range of 275° to 325° C. and preferably 300° C.; $WF_6$ partial pressure in a range of 10–50 milliTorr (mTorr) and preferably 20 mTorr; total pressure in a range of 30,000 to 100,000 mTorr and preferably 40,000 mTorr (40 Torr); $H_2$ flow in the range of 5–10 Standard Liters/Minute (SLM) and preferably 9 SLM for $H_2$; Ar flow in the range of 10–20 SLM and preferably 14 SLM; and $WF_6$ in the range of 5–10 sccm and preferably 5 sccm. To limit selectivity loss (deposition of W on oxide), silane is turned off in the third step. The time for the third step is about 3–5 seconds to provide about an additional 100 A W. Times greater than 5 sec. may be selected for the third step to thicken the W layer to 300–400 A without selectivity loss depending on device requirements.

The times of the first and second steps are selected such that about 100 A of W has been deposited by the end of the second step (at which time $SiH_4$ is turned off). The 100 A of W provides an adequate barrier to diffusion of Si. Thus, the third step does not result in further Si consumption or encroachment. Other advantages of the third step vs. the second step are deposition of a smoother film, fewer paths for loss of selectivity, and elimination of excess Si that may deposit from the $SiH_4$ reduction reaction in the second step.

Figure 4:
FIG. 4 is an SEM after deposition of the third step of a preferred embodiment of the present invention on a PFET.
Figure 5:
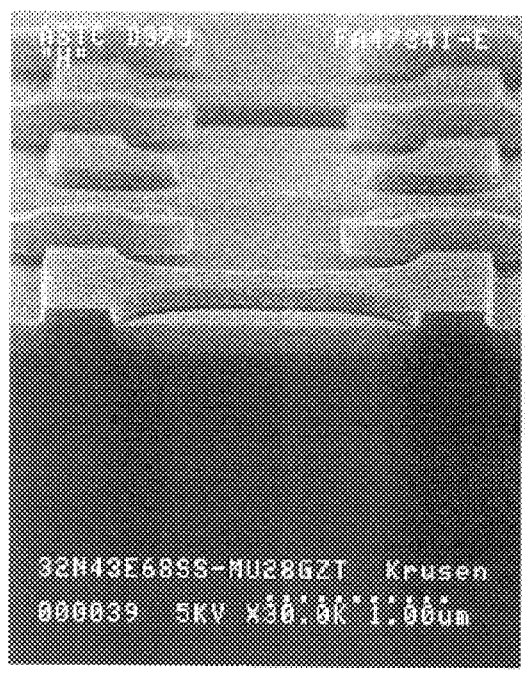
FIG. 5 is an SEM after deposition of the third step of a preferred embodiment of the present invention on an NFET.

FIG. 4 is a Scanning Electron Micrograph (SEM) of a the Source/Drain (S/D) region of a p+ field effect transistor (PFET) following the third deposition step. FIG. 5 is an SEM of the Source/Drain region of an NFET following the third deposition step.

The morphology of the PFET and NFET regions are relatively smooth after deposition. The smooth surface provides more effective results during the post processing steps. For example, the device will have improved contact resistance, minimizing device failure. In addition, alignment for photolithography is more readily achieved with a smoother surface. The surrounding oxide regions do not show any W deposition.

Figure 3:
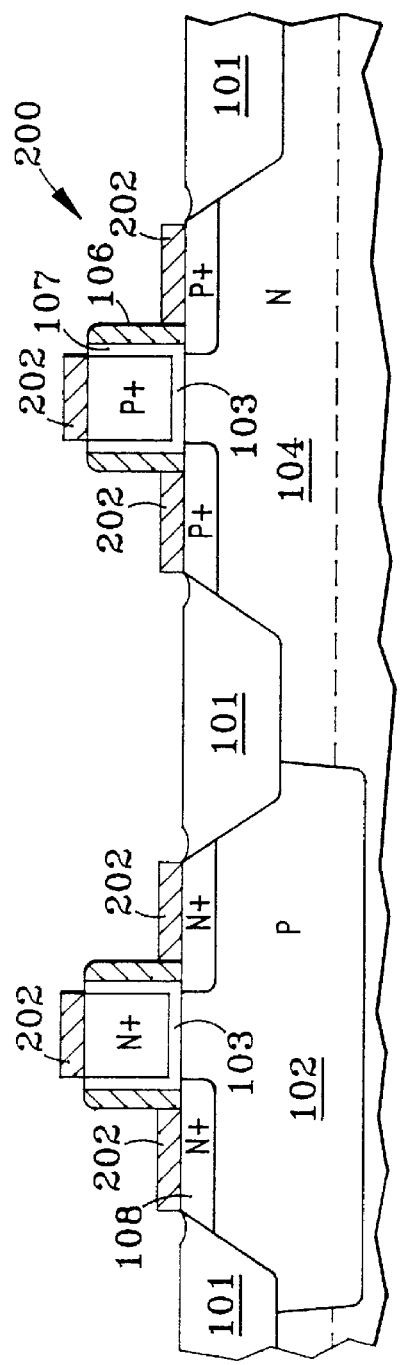
FIG. 3 is a diagrammatic view of a preferred embodiment of the present invention following selective W deposition.

In FIG. 3, the integrated circuit device 200 is illustrated following selective W deposition. The W deposition is shown at the 202. Using the times for each of the three steps above, the total W thickness will range between about 200–300 A. The W deposition 202 covers the n+ gate stack 112 and p+ gate stack 114 as well as the lightly drained implants 108 and 110.

Prophetically, the refractory metal Mo may also be used in a three step process. The processing steps for Mo would be performed at parameters similar to W and would include the steps of:

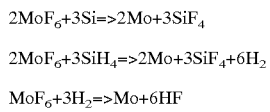

$2MoF_6+3Si => 2Mo+3SiF_4$     1.

$2MoF_6+3SiH_4 => 2Mo+3SiF_4+6H_2$     2.

$MoF_6+3H_2 => Mo+6HF$     3.

This invention adequately addresses the difficulties of uneven n+ versus p+ (source/drain) growth, deep consumption/encroachment by the refractory metal into silicon regions (e.g., worm holes), poor adhesion, uncontrolled selectivity and uneven morphology.

EXAMPLE

This example describes the deposition of W on a Si substrate. A 200:1 DHF dip was used to remove 150 A of native oxide. Commercially available blanket CVD W equipment was used to deposit W on a substrate with exposed silicon areas in a mostly oxide field. At 300° C. perform the sequence: 1 sec. Si reduction of $WF_6$, 3 sec. $SiH_4$ reduction of $WF_6$, and 5 sec. $H_2$ reduction of $WF_6$ to deposit about 200–300 A W over exposed Si areas. Excellent selectivity was achieved on the center and edge of the wafer. Equal deposition was achieved over the n and p regions and the W films did not peel after anneal at 500° C. for 30 min. No special hardware modifications to the commercially available blanket CVD W reactor were required and a vacuum integrated sequence to clean the Si surface before the onset of W deposition was not required.

What is claimed is:

1. A method for selectively depositing a refractory metal on exposed surfaces of a silicon substrate having oxide regions thereon, the method comprising the steps of:
   a). selectively depositing a refractory metal on said exposed surfaces of said silicon substrate by reacting a refractory metal halide with the exposed surfaces of said silicon substrate;
   b). limiting silicon substrate consumption by reacting the refractory metal halide with a silicon containing gas; and
   c). reacting the refractory metal halide with hydrogen to thereby maintain selectivity.

2. The method of claim 1, wherein step a) comprises:
   selectively depositing the refractory metal on source/drain diffusion regions at nearly identical rates.

3. The method of claim 1, wherein the refractory metal is tungsten and the refractory metal halide is tungsten hexaflouride.

4. The method of claim 1, wherein the refractory metal is molybdenum and the refractory metal halide is molybdenum hexaflouride.

5. The method of claim 1, wherein the steps further comprise: depositing a selective refractory metal utilizing blanket equipment.

6. The method of claim 5, wherein step a). further comprises selectively depositing the refractory metal at a total pressure range of 30 to 100 Torr; and wherein step b). further comprises limiting silicon substrate consumption at a total pressure range of 30 to 100 Torr.

7. The method of claim 1, wherein step a). further comprises:
   selectively depositing the refractory metal on the silicon substrate for a period of about 1 second.

8. The method of claim 1, further comprising before step a). the step of:
   d). preconditioning the siliconsubstrate, wherein said preconditioning step consists of a DHF dip to thereby eliminate native oxides.

9. The method of claim 1, wherein after step c). the refractory metal has a thickness greater than 100 Angstroms and the silicon consumption is less than 100 Angstroms.

10. The method of claim 1, wherein step a). comprises:
    exposing $WF_6$ to the silicon substrate at a flow rate of 5–10 sccm; a temperature range of 275° to 325° C.; a partial pressure range of 10–50 milliTorr (mTorr) for $WF_6$; a total pressure range of 30 to 100 Torr; a period of about 1 second; and a flow rate of 10,000–20,000 standard cubic centimeters/minute (sccm) for Argon (Ar).

11. The method of claim 1, wherein the refractory metal is deposited by chemical vapor deposition.

12. The method of claim 1, wherein the silicon containing gas is $SiH_4$.

13. A method for selective refractory metal deposition comprising the steps of:
    a). providing a blanket Chemical Vapor Deposition (CVD) reactor;
    b). placing a wafer into said blanket CVD reactor; and
    c). selectively depositing a refractory metal on said wafer at a total pressure in a range of 30 to 100 Torr and a temperature in a range of 275° to 325° C.

14. The method of claim 13, wherein step c) further comprises a pressure of 40 Torr.

15. The method of claim 13, wherein step c) further comprises a temperature of 300° C.

16. The method of claim 13, wherein step c) further comprises the steps of:
    d). selectively depositing a refractory metal on said wafers having an exposed surfaces of a silicon substrate by reacting a refractory metal halide with the exposed surfaces of said silicon substrate;
    e). limiting silicon substrate consumption by reacting the refractory metal halide with a silicon containing gas; and
    f). increasing the refractory metal thickness by reacting the refractory metal halide with hydrogen.

17. The method of claim 16, wherein the reaction ratio of the silicon containing gas to refractory metal halide in step e) is 5–15.

18. The method of claim 13, further comprising the step of:

preconditioning the silicon substrate, wherein said preconditioning step consists of a DHF dip to thereby eliminate native oxides.

19. The method of claim 1, wherein step b). comprises:

reacting the refractory metal halide and silane gas at a temperature in a range of 275° to 325° C.; a $WF_5$ partial pressure in the range of 10–50 mTorr; a total pressure range of 30 to 100 Torr; an $H_2$ flow in the range of 5–10 Standard Liters/Minute (SLM); Ar flow in the range of 10–20 SLM; $SiH_4$ flow in the range of 40–50 sccm.

* * * * *